United States Patent
Nojima

(10) Patent No.: US 10,770,887 B2
(45) Date of Patent: Sep. 8, 2020

(54) SEMICONDUCTOR CIRCUIT INTERRUPTION DEVICES USING CURRENT FILTERING TO IMPROVE DEVICE COORDINATION

(71) Applicant: Eaton Intelligent Power Limited, Dublin (IE)

(72) Inventor: Geraldo Nojima, Matthews, NC (US)

(73) Assignee: Eaton Intelligent Power Limited (IE)

( * ) Notice: Subject to any disclaimer, the term of this patent is extended or adjusted under 35 U.S.C. 154(b) by 838 days.

(21) Appl. No.: 15/291,482

(22) Filed: Oct. 12, 2016

(65) Prior Publication Data

US 2017/0104327 A1 Apr. 13, 2017

Related U.S. Application Data

(60) Provisional application No. 62/240,117, filed on Oct. 12, 2015.

(51) Int. Cl.
*H02H 3/44* (2006.01)
*H03K 17/72* (2006.01)
*H02H 7/30* (2006.01)

(52) U.S. Cl.
CPC ............... *H02H 3/44* (2013.01); *H02H 7/30* (2013.01); *H03K 17/72* (2013.01)

(58) Field of Classification Search
CPC .......... H02H 1/0015; H02H 3/08; H02H 3/16; H02H 3/20; H02H 3/207; H02H 3/22; H02H 3/24; H02H 3/44; H02H 3/46; H02H 3/50; H02H 7/30; H02H 3/087; H03K 17/72; H03K 17/0822; H02M 3/156; H02M 2001/0009; H02M 3/158
See application file for complete search history.

(56) References Cited

U.S. PATENT DOCUMENTS

| | | | |
|---|---|---|---|
| 8,040,644 B2 * | 10/2011 | Hastings | H02H 7/30 361/2 |
| 9,728,986 B2 * | 8/2017 | Bernardon | H02M 1/36 |
| 10,111,315 B1 * | 10/2018 | Lai | H02M 1/32 |
| 2003/0117816 A1 * | 6/2003 | Pai | H02M 7/493 363/40 |

(Continued)

FOREIGN PATENT DOCUMENTS

WO WO 2015/124885 8/2015

OTHER PUBLICATIONS

Notification Concerning Transmittal of International Preliminary Report on Patentability, PCT/US2016/056512, dated Apr. 26, 2018, 7 pages.

(Continued)

*Primary Examiner* — Jared Fureman
*Assistant Examiner* — Nicolas Bellido
(74) *Attorney, Agent, or Firm* — Stanek Lemon Crouse & Meeks, P.A.

(57) ABSTRACT

An apparatus includes a semiconductor switch configured to interrupt a current between a power source and a load, an inductor coupled in series with the semiconductor switch, and a capacitor coupled to a node between the inductor and the load. The apparatus further includes a current sensor configured to sense a current provided to the load and a control circuit coupled to the current sensor and configured to control the semiconductor switch responsive to the sensed current.

11 Claims, 5 Drawing Sheets

(56) References Cited

U.S. PATENT DOCUMENTS

| | | | |
|---|---|---|---|
| 2005/0057869 A1* | 3/2005 | Hale | H02H 5/10 |
| | | | 361/64 |
| 2006/0043942 A1* | 3/2006 | Cohen | H02M 3/156 |
| | | | 323/207 |
| 2010/0149700 A1 | 6/2010 | Hastings et al. | |
| 2010/0164446 A1* | 7/2010 | Matsuo | H02M 3/156 |
| | | | 323/282 |
| 2012/0139514 A1* | 6/2012 | Paatero | H02M 3/156 |
| | | | 323/282 |
| 2012/0235661 A1* | 9/2012 | Roessler | H03K 17/0822 |
| | | | 323/284 |
| 2014/0009134 A1* | 1/2014 | Bernardon | H02M 1/36 |
| | | | 323/284 |
| 2014/0217833 A1* | 8/2014 | Rong | H02H 3/087 |
| | | | 307/113 |
| 2014/0347897 A1 | 11/2014 | Broussard et al. | |
| 2014/0376140 A1* | 12/2014 | Wu | H01H 9/548 |
| | | | 361/100 |
| 2016/0359311 A1* | 12/2016 | Handy | H02H 9/025 |

OTHER PUBLICATIONS

International Search Report and Written Opinion; corresponding application No. PCT/US2016/056512; dated Jan. 31, 2017; 11 pages.
EP Office Action; EP Appln. No. 16791151.0; dated Apr. 2, 2020; 5 pages.

* cited by examiner

Ｕ S 10,770,887 B2

SEMICONDUCTOR CIRCUIT INTERRUPTION DEVICES USING CURRENT FILTERING TO IMPROVE DEVICE COORDINATION

RELATED APPLICATION

The present application claims the benefit of U.S. Provisional Patent Application Ser. No. 62/240,117 entitled SEMICONDUCTOR CIRCUIT INTERRUPTION DEVICES USING CURRENT FILTERING TO IMPROVE DEVICE COORDINATION, filed Oct. 12, 2015, the contents of which is incorporated by reference herein in its entirety.

BACKGROUND

Electromechanical circuit breakers typically require several line cycles to open a fault current, so conventional fault coordination solutions used for electromechanical circuit breakers have a great amount of time to function. Such solutions may not be feasible in systems using static circuit breakers, which are typically much faster and may interrupt fault currents in less than a millisecond.

Although static circuit breakers may be faster, they typically cannot open for fault current having an amplitude several times the breaker nominal operating current. Accordingly, it is desirable that a static circuit breaker operate quickly. A typical static circuit breaker includes power semiconductor switches, such as insulated-gate bipolar transistors (IGBTs) or integrated gate-commutated thyristors (IGCTs) that are configured for uni- or bi-directional conduction. To deal with thermal limitations of these devices, a solid circuit breaker may interrupt the current before it reaches 200 percent of the nominal operating current.

SUMMARY

Some embodiments of the inventive subject matter provide an apparatus including a semiconductor switch configured to interrupt a current between a power source and a load, an inductor coupled in series with the semiconductor switch, and a capacitor coupled to a node between the inductor and the load. The apparatus further includes a current sensor configured to sense a current provided to the load and a control circuit coupled to the current sensor and configured to control the semiconductor switch responsive to the sensed current.

In some embodiments, the current sensor may include a first current sensor coupled between the inductor and the load and a second current sensor coupled between the power source and the inductor. The control circuit may be coupled to the first and second current sensors and is configured to control the semiconductor switch responsive to first and second currents sensed by the first and second current sensors.

In further embodiments, the control circuit may be configured to determine a rate of change of the sensed current and to responsively control the semiconductor switch. The control circuit may be configured to open the semiconductor switch responsive to the determined rate of change exceeding a rate of change threshold. In some embodiments, the control circuit may be configured to determine the rate of change threshold responsive to a voltage applied by the power source. In some embodiments, the control circuit may be configured to adjust the rate of change threshold responsive to the sensed current.

Further embodiment of the inventive subject matter provide a circuit interruption device including an input port configured to be coupled to a power source, an output port configured to be coupled to a load, a semiconductor switch configured to interrupt a current between the input port and the output port, an inductor coupled in series with the semiconductor switch, and a capacitor coupled to a node between the inductor and output port. The circuit interruption device further includes a current sensor configured to sense a current provided to the output port and a control circuit coupled to the current sensor and configured to transition the semiconductor switch to a non-conducting state responsive to the sensed current.

Still further embodiments of the inventive subject matter provide a circuit interruption device including an input port configured to be coupled to a power source, an output port configured to be coupled to a load, a semiconductor switch configured to interrupt a current between the input port and the output port, and a low-pass filter coupled in series with the semiconductor switch. The circuit interruption device further includes a current sensor configured to sense a current provided to the output port and a control circuit coupled to the current sensor and configured to control the semiconductor switch responsive to the sensed current.

DETAILED DESCRIPTION

Figure 1:
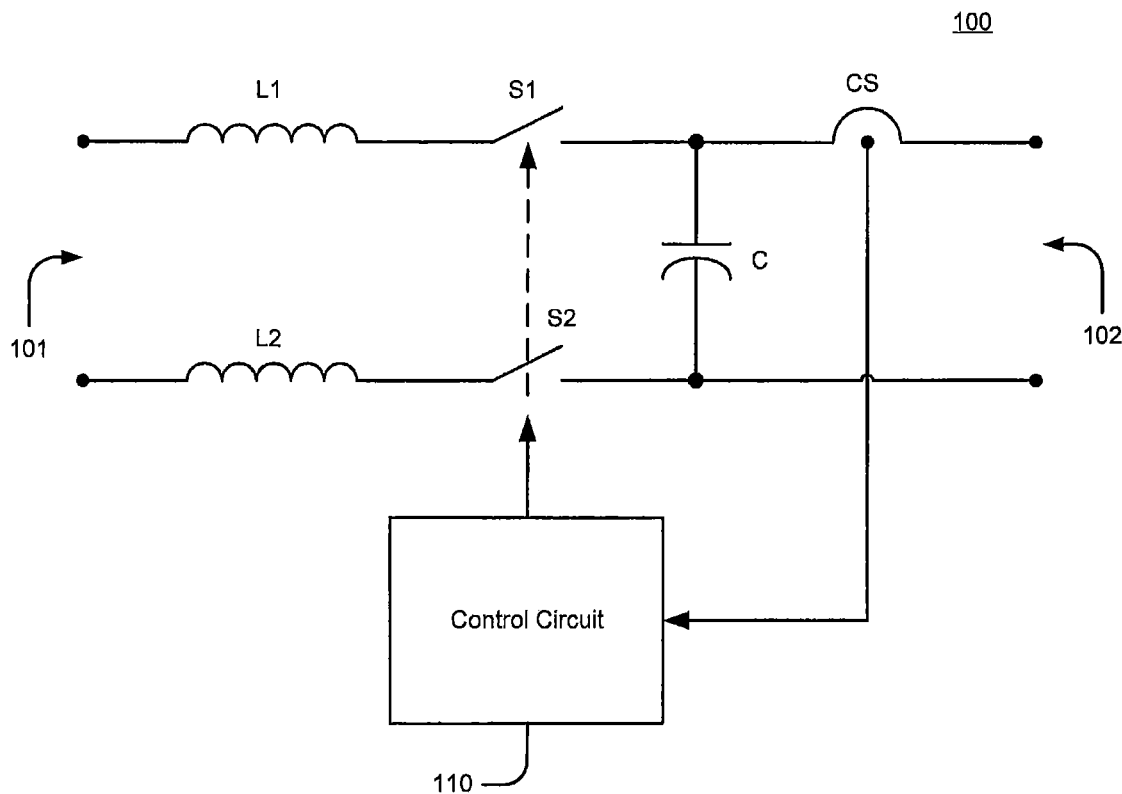
FIG. 1 is a schematic diagram illustrating a circuit interruption apparatus according to some embodiments of the inventive subject matter.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Static circuit breakers rely on relatively fast commutating power semiconductor switches to interrupt fault current before it becomes a multiple of the circuit breaker rated current. This fast commutation is desirable for DC circuit breaker applications, but the very fast speed of commutation imposes a challenge when two or more static circuit breakers are connected in series in a distribution system. In particular, it is desirable that the appropriate circuit breaker, i.e., the one closest to the fault, is tripped, leaving upstream breakers on to continue supplying power to their loads.

Some embodiments of the inventive subject matter use a circuit topology that can provide improved fault coordination of a string of static circuit breakers or other semiconductor circuit interruption devices. In some embodiments, an inductor is provided in series with the semiconductor switch(es) to limit a rate of change of the fault current. By providing the inductance, the current rate of change for an upstream device can be slowed down, enabling circuit breaker coordination without requiring inter-device signaling or other complex controls.

A potential problem with using such inductances alone is that proper coordination may require large inductors, which may increase losses, size and cost. In some embodiments, a capacitor may be placed between the inductor and the output of the circuit breaker to effectively decouple the input and output of the breaker between the moment of the fault and the opening of the semiconductor switch. The inductor and capacitor used in such a combination can each be relatively small, which can reduce losses, size and cost. When a fault occurs at the static circuit breaker output, the inductor can limit the current rate of change seen by the input side source while the capacitor can provide energy to the fault to aid in triggering the circuit breaker. In this manner, tripping of the upstream breaker may therefore be avoided. While such techniques can be particularly useful in DC distribution systems in which fast circuit interruption is desired, they may also be used for AC circuit interruption devices.

Figure 2:
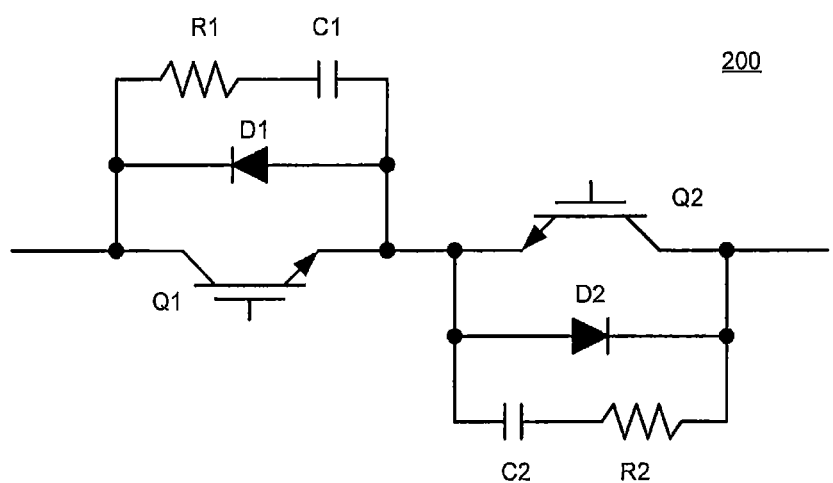
FIG. 2 is a schematic diagram illustrating switches of the circuit interruption apparatus of FIG. 1.

FIG. 1 illustrates an apparatus 100 according to some embodiments of the inventive subject matter. The apparatus 100 includes an input port 101, which is configured to be coupled to a power source, and an output port 102, which is configured to be coupled to a load. The apparatus further includes semiconductor switches S1, S2, which are configured to interrupt a current between the input port 101 and the output port 102. As illustrated in FIG. 2, a semiconductor switch structure 200 that may be used for each of the semiconductor switches-S1, S2 may include serially-connected insulated-gate bipolar transistors (IGBTs) Q1, Q2, each with accompanying diodes D1,D2 and snubber circuits including resistors R1, R2 and capacitors C1, C2. It will be appreciated that the switch structure shown in FIG. 2 is provided as an example, and that other semiconductor switch arrangements (such as those using other types of devices, such as IGCTs) may be used in some embodiments of the inventive subject matter.

Referring again to FIG. 1, inductors L1, L2 are provided between respective ones of the switches S1, S2 and respective terminals of the input port 101. A capacitor C is coupled across the output port 102. A current sensor CS is configured to sense a current provided to the output port 102 from a point between the capacitor C and the output port 102. A control circuit 110 controls the switches S1, S2 responsive to the current sensed by the current sensor CS.

An exemplary application for the apparatus 100 is in circuit interruption devices (e.g., circuit breakers) used in DC and/or AC power distribution applications. In such applications, for example, the control circuit 110 may be configured to open the switches S1, S2 when the current sensed by the current sensor CS meets a predetermined criterion, e.g., exceeds a predetermined threshold and/or other criteria. In such applications, the inductors L1, L2 and the capacitor C may reduce the likelihood of triggering of a similar upstream circuit interruption device. In particular, when a fault occurs downstream of the output port 102, the inductors L2 may momentarily impede current flow from the input port 101, while the capacitor C discharges into the fault to help maintain a current level sufficient to cause the control circuit to open the switches S1, S2 and thereby isolate the fault. This may allow for isolation of the fault before current at an upstream circuit interruption device reaches a level sufficient to trigger opening of the upstream device. In this manner, faults can be isolated at the appropriate level of the power distribution system.

Figure 3:
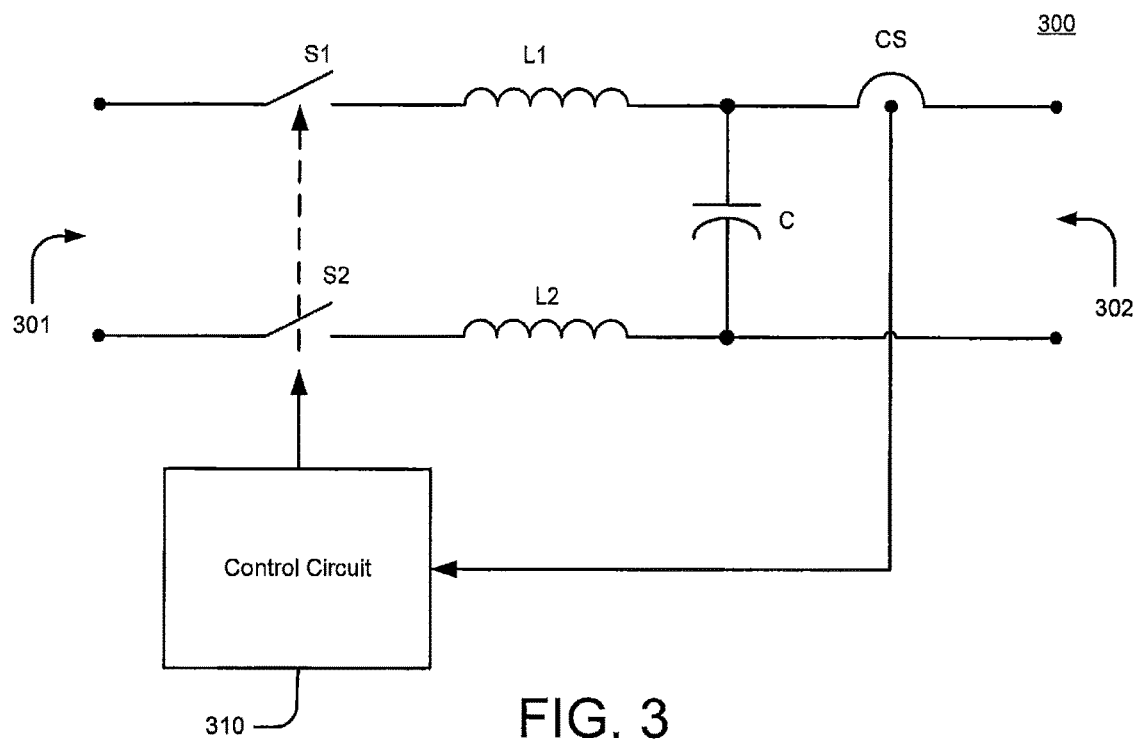
FIG. 3 is a schematic diagram illustrating a circuit interruption device with a different circuit configuration according to further embodiments of the inventive subject matter.

It will be appreciated that other embodiments may use circuit arrangements other than the one illustrated in FIG. 1. For example, FIG. 3 illustrates an apparatus 300 including semiconductor switches S1, S2 coupling an input port 301 to respective inductors L1, L2. A capacitor is coupled between the inductors L1, L2. A current sensor CS monitors a current provided to an output port 302. A control circuit 310 operates the switches S1, S2 responsive to the current sensed by the current sensor CS. Similar to the apparatus 100 of FIG. 1, the switches S1, S2 may utilize a circuit arrangement along the lines discussed above with reference to FIG. 2, and the circuit configuration illustrated in FIG. 3 may provide the operational characteristics described above with reference to FIGS. 1 and 2. It will be further understood that other embodiments may use still other circuit configurations. For example, some embodiments may use other filter arrangements (e.g., higher order filters comprising other arrangements of inductors and capacitors) to provide similar operations.

Figure 4:
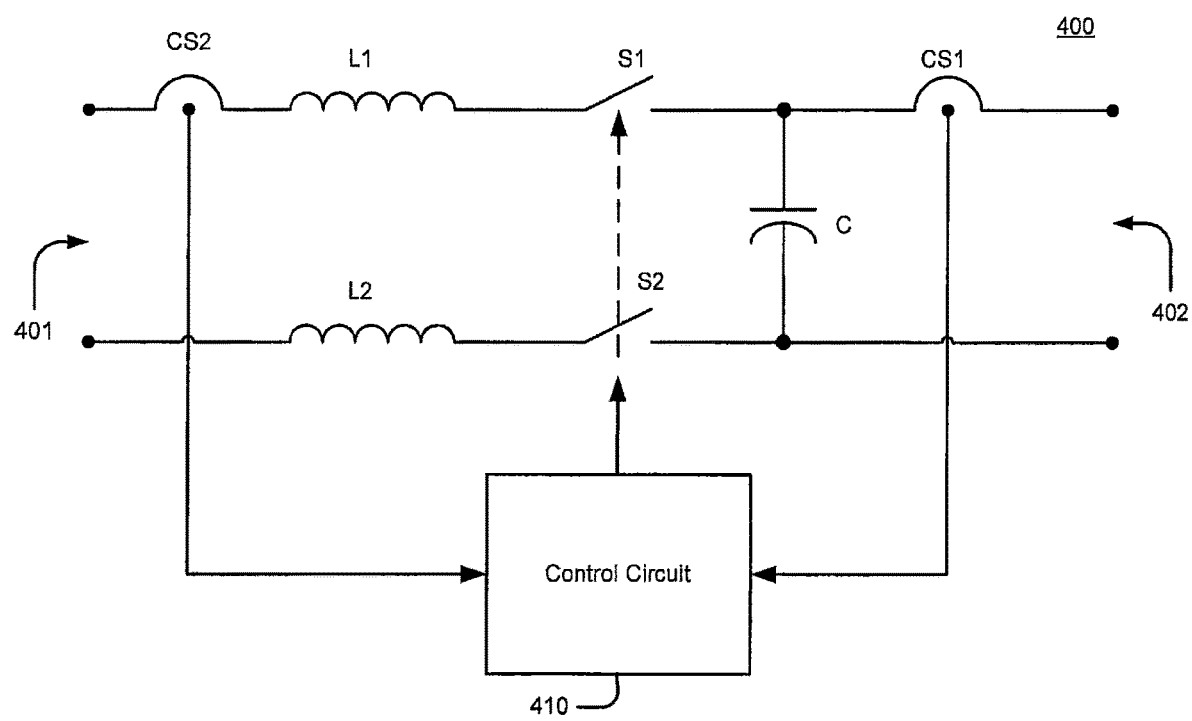
FIG. 4 is a schematic diagram illustrating a circuit interruption device with multiple current sensors according to some embodiments of the inventive subject matter.

FIG. 4 illustrates a circuit interruption apparatus 400 according to further embodiments. Similar to the apparatus 100 of FIG. 1, the apparatus 400 includes switches S1, S2, inductors L1, L2, and a capacitor C. A first current sensor CS1 is configured to monitor a current provided at an output port 402, and a second current sensor is configured to monitor a current at an input port 401. A control circuit 410 is configured to control the switches S1, S2 responsive to the currents sensed by the first and second current sensors CS1, CS2. For example, the control circuit 410 may be configured to monitor a difference between the sensed current and, when the difference indicates a line fault at the output port 402, the control circuit 410 may open the switches S1, S2. The sensor arrangement illustrated in FIG. 4 may be advantageous in detecting such faults, as a short circuit presented to the output port 402 will lead to a temporary difference between the input and output currents due to the low-pass filtering effect of the inductors L1, L2 and the capacitor C. This sensor arrangement may also be advantageous for detection of intermittent faults (e.g., arc faults, insulation deterioration, intermittent short circuits, etc.).

Figure 5:
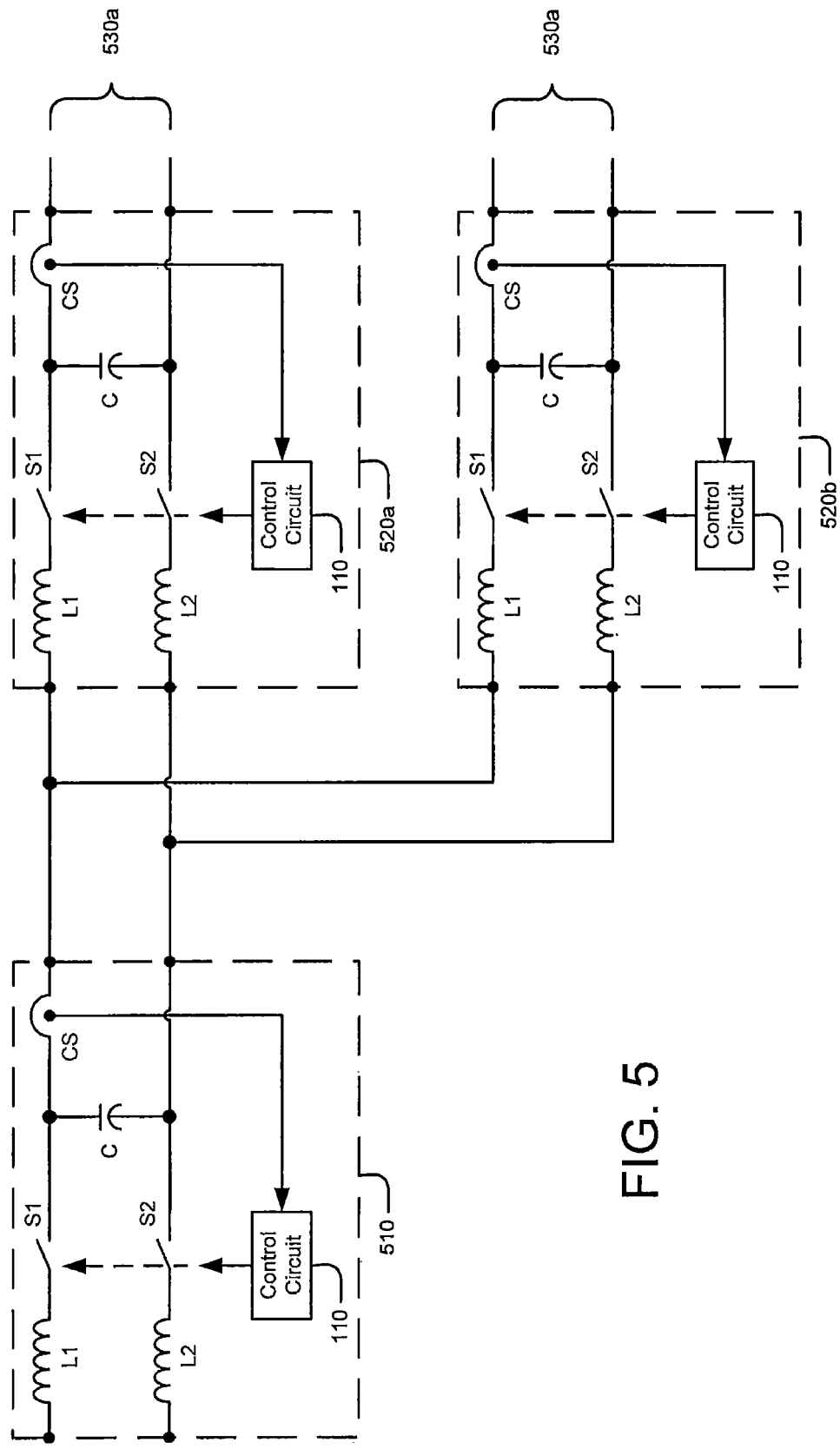
FIG. 5 illustrates a power distribution system including circuit interruption devices according to further embodiments of the inventive subject matter.

FIG. 5 illustrates an example of an application of circuit interruption apparatus in a power distribution system. Semiconductor circuit breakers 520a, 520b may have inputs coupled in parallel to an upstream circuit breaker 510 and protect respective branch circuits 530a, 530b. The circuit breakers 510, 520a, 520b may be configured as described above with reference to FIG. 1. As discussed above, the use of filtering inductors L1, L2 and capacitor C in the circuit breakers 510, 520a, 520b may aid in coordination of the operation of the circuit breakers 510, 520a, 520b, such that, when a fault occurs on one of the branch circuits 530a, 530b, the corresponding one of the circuit breakers 520a, 520b trips while leaving the upstream circuit breaker 510 untripped.

As an example, inductors such as the inductors L1, L2 of FIG. 1 may be sized to limit the fault current to a maximum designated rate. The maximum value of the fault current might be ideally about 150% of the rated current of a solid state circuit breaker at the time when the switches S1, S2 are completely off. It may be desirable that the fault current through the semiconductor switches S1, S2 not exceed 200% of rated current so as to not compromise reverse bias safe operating area (RBSOA), as well as to limit the thermal and magnetic stresses that otherwise will reduce the semiconductor switch useful life.

Figure 6:
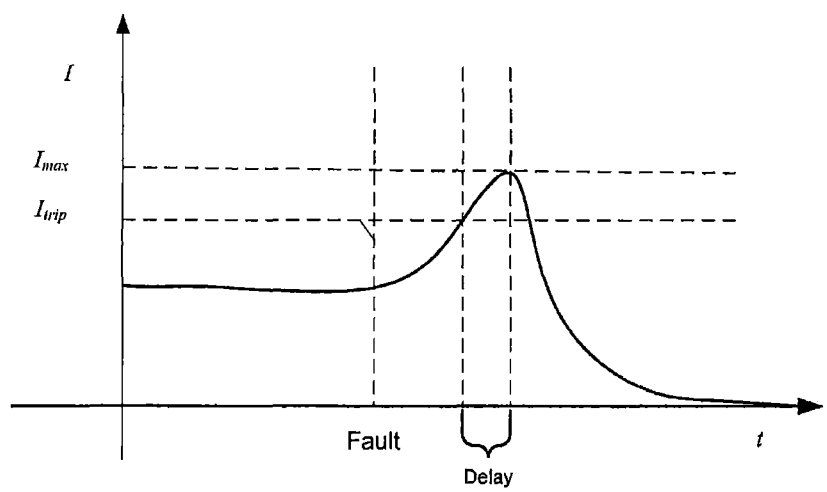
FIG. 6 illustrates current interruption operations according to some embodiments of the inventive subject matter.

Referring to FIG. 1 and FIG. 6, the control circuit 110 may send a signal to turn off the switches S1, S2 upon detecting an over current which is below 150% (e.g., around 130%) of the circuit breaker rated current. Because power semiconductor switches typically have a delay time of a few microseconds, the fault current may continue to climb to around 150% of the rated current before the semiconductor switches S1, S2 actually open.

The rate of fault current increase is limited by the total fault path inductance, which includes the inductors L1, L2. The highest di/dt may occur when a short circuit occurs immediately at the output of the breaker, in which case the inductors L1, L2 will be the predominant means of limiting the fault current di/dt. The following formulas apply:

$$(L1+L2)=V_{source}*dt_{igbt}*di_{max}^{(-1)},$$

where L1 and L2 are the inductors installed in the circuit breaker, Vsource is the distribution system voltage, $dt_{igbt}$ is the delay and fall time of the semiconductor switch (per specification at worst case temperature and considering that the controls response time is negligible), and $di_{max}$ is calculated from the $I_{max}$ desired (150%, for example) minus the $I_{trip}$ (overcurrent detection level—130% for example). The losses in L1 and L2—$P_{(L1+L2\_power\_losses)}$—in a DC distribution will be mainly due to their ohmic resistance—$R_{(L1+L2)}$—and the distribution current—$I_{distr}$—value:

$$P_{(L1+L2\_power\_losses)}=I_{distr}*R_{(L1+L2)}$$

Guidelines for sizing of the shunt capacitor C may include:

a) positioning the capacitor after the semiconductor switch such that its discharge current, during a fault, does not pass through the semiconductor switches;
b) the capacitor is connected after the inductors L1 and L2;
c) it is desirable that the value of the capacitor be evaluated for resonance during distribution disturbances and harmonics present; and
d) the capacitance is desirably large enough to provide sufficient fault current to trip the circuit breaker even when the load current is close to zero.

A formula for the capacitance is given by:

$$C=I_{max}*dt_{ctrl}*V_{source}^{(-1)},$$

where C is the capacitance value, $I_{max}$ is the current reached when the semiconductor switches are completely off and $dt_{ctrl}$ is the controls fault detection delay time.

The solution shown in FIG. 1 does enable the detection of insulation degradation that causes transitional decrease of insulation resistance. It can also detect arcing and bad contact type faults. By adding a current sensor before the inductor and another after the capacitor the controller circuit can have enough information to decide if the circuit is in:

a. normal operation (the input current is equal or greater than the output current);
b. fault condition (the input current is smaller than the output current while the capacitor is discharging and the overcurrent trip point is achieved); or
c. intermittent fault condition (the overcurrent trip point is not achieved but the input current is smaller than the output current).

In condition b), the circuit breaker may be opened, while in condition c), the circuit breaker may remain closed and an alarm asserted (e.g., a warning message to the operator indicating detection of an anomaly).

Higher order filters other than those illustrated may be used. It is believed that, generally, even order low pass filters may be applicable.

Figure 7:
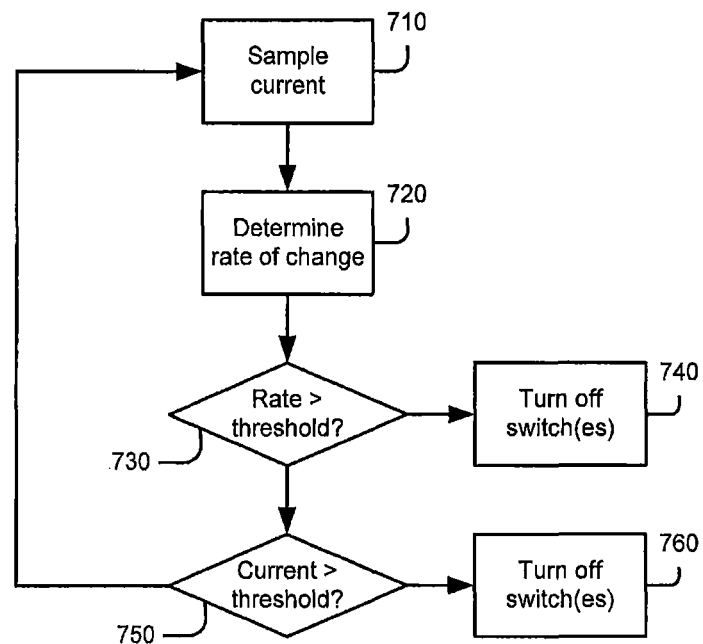
FIG. 7 is a flowchart illustrating operations of a circuit interruption apparatus according to some embodiments of the inventive subject matter.

FIG. 7 illustrates operations of a solid state circuit breaker according to some embodiments. An output current of the breaker is sampled using, for example, a current sensor CS as illustrated in FIG. 1 or FIG. 3 (block 710). A rate of change in the current may then be determined by, for example, determining a change between successive current samples or a change of an average current determined from the current samples (block 720). In some embodiments, a rate of change could be determined by comparing contemporaneous current samples from input and output current sensors (e.g., the sensors CS1, CS2 of FIG. 4), as the circuit breaker inductor (e.g., L1 of FIG. 4) may provide sufficient delay for this measurement to indicate the rate of change of current at the breaker output.

If the rate of change in the current exceeds a certain threshold value indicative of a fault, the circuit breaker is opened (blocks 730, 740). The threshold may be determined, for example, based on an input voltage applied to the circuit breaker (which may be measured and/or assumed to be a certain nominal voltage) and the known inductance of the circuit breaker (e.g., the inductors L1/L2 shown in FIG. 1). In particular, for a hard ground fault at an output of the circuit breaker, a di/dt value may be derived from the relationship:

$$V=L(di/dt).$$

The threshold may be set, for example, at a value that corresponds to the di/dt value for a hard fault at the output of the circuit breaker for the known input voltage and inductance, minus a certain margin. If the rate of change of the output current exceeds such a threshold, it is likely that a fault is present, thus necessitating opening of the breaker. If the determined rate of change does not exceed the rate of change threshold, but the sampled current (or an average value derived therefrom) exceeds a predetermined current threshold corresponding to an overload, the circuit breaker may also be opened (blocks 750, 760). It will be understood that after the circuit breaker is opened, it may be reclosed and again retested to determine whether a persistent fault or overload condition is present using, for example, the current monitoring operations illustrated in FIG. 7.

The rate of change in current (di/dt) through an inductor is defined by the inductor and the voltage drop across it. The voltage drop across the inductor is defined by the source voltage minus the transient load voltage. The transient load voltage is defined by the load impedance at the time when the load is turned on (e.g., at the output side of the circuit interruption device). At that moment in time the inductor will resist the change in current from the source and thus the impedance of the turned-on load will reduce the load side voltage after the output capacitor discharges into it. Because the load current is below the maximum circuit breaker threshold, the current never reaches the tripping point, but the rate of change in the current is also below that of a fault current condition:

$$di/dt = V\text{source} - V\text{load},$$

where $$V\text{load} = V\text{source} - V\text{inductor}.$$

The maximum di/dt is reached when Vload=0, which is the case when there is a short circuit. Therefore, a tripping di/dt can be calculated even for cases when the short-circuit is partial (i.e., Vload is not equal to zero) to differentiate from normal loads. The current rate of change can be used as a look-ahead measurement for preparing the circuit breaker to trip before a maximum current level is reached.

Figure 8:
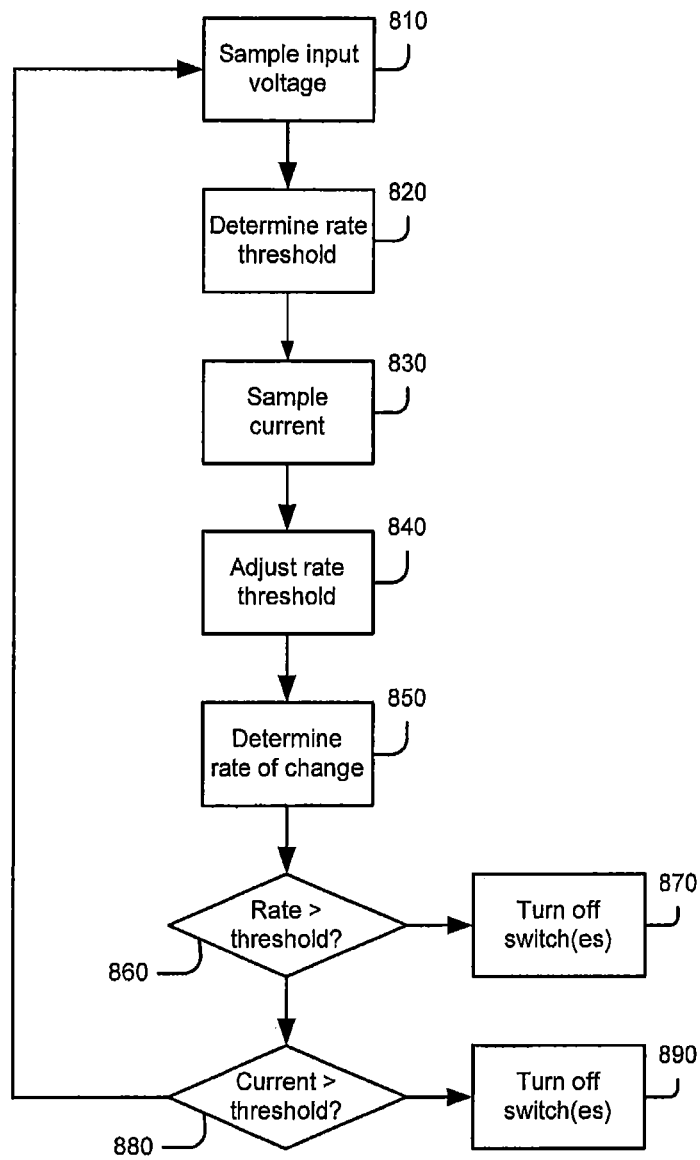
FIG. 8 is a flowchart illustrating operations of circuit interruption apparatus according to further embodiments of the inventive subject matter.

According to further embodiments, a current rate of change threshold may be adaptively adjusted based on input voltage and current loading. Referring to FIG. 8, an input voltage applied to the circuit breaker may be sampled and a current rate of change threshold determined based on the sampled voltage (blocks 810, 820). Current at the output of the circuit breaker may subsequently sampled (block 830). Based on the sampled current level (or an average derived therefrom), the rate of change threshold may be adjusted (block 840). For example, if the breaker is relatively heavily loaded, it may be desirable to set the rate of change threshold lower, as the current may more quickly rise to levels that may be damaging to the semiconductor switch(es), thus making it desirable to more quickly move to open the breaker. This may increase the likelihood of false tripping, but this situation may be addressed by reclosing the breaker and retesting for a fault or overload using techniques along lines discussed above. In addition, the likelihood of spurious tripping may be reduced by filtering or averaging current sense measurements and rate of change estimates.

If the rate of change of the current exceeds the threshold, the switch(es) of the breaker may be opened (blocks 860, 870). If rate of change does not exceed the rate of change threshold, but the sampled current (or an average derived therefrom) exceeds an overload current limit, the switch(es) may also be opened (blocks 880, 890).

In this specification, there have been disclosed embodiments of the inventive subject matter and, although specific terms are employed, they are used in a generic and descriptive sense only and not for purposes of limitation. The following claims are provided to ensure that the present application meets all statutory requirements as a priority application in all jurisdictions and shall not be construed as limiting the scope of the inventive subject matter.

What is claimed:

1. An apparatus comprising:
   a circuit breaker comprising a semiconductor switch configured to interrupt a current between a power source and a load;
   an inductor coupled in series with the semiconductor switch;
   a capacitor coupled to a node between the inductor and the load;
   a current sensor configured to sense a current provided to the load from the node; and
   a control circuit coupled to the current sensor and configured to determine a rate of change of the sensed current and to open the semiconductor switch responsive to the determined rate of change of the sensed current exceeding a rate of change threshold.

2. The apparatus of claim 1, wherein the control circuit is configured to determine the rate of change threshold responsive to a voltage applied by the power source.

3. The apparatus of claim 1, wherein the control circuit is configured to adjust the rate of change threshold responsive to the sensed current.

4. The apparatus of claim 1, wherein the power source comprises another circuit breaker.

5. A circuit interruption device comprising:
   an input port configured to be coupled to a power source;
   an output port configured to be coupled to a load;
   a semiconductor switch configured to interrupt a current between the input port and the output port;
   an inductor coupled in series with the semiconductor switch;
   a capacitor coupled to a node between the inductor and output port;
   a current sensor configured to sense a current provided to the output port from the node; and
   a control circuit coupled to the current sensor and configured to transition the semiconductor switch to a non-conducting state responsive to the sensed current indicating a fault, wherein the control circuit is configured to determine a rate of change of the sensed current and to open the semiconductor switch responsive to the determined rate of change of the sensed current exceeding a rate of change threshold.

6. The circuit interruption device of claim 5, wherein the control circuit is configured to determine the rate of change threshold responsive to a voltage applied by the power source.

7. The circuit interruption device of claim 5, wherein the control circuit is configured to adjust the rate of change threshold responsive to the sensed current.

8. The circuit interruption device of claim 5, wherein the power source comprises a circuit breaker.

9. A circuit breaker comprising:
   an input port configured to be coupled to a power source;
   an output port configured to be coupled to a load;
   a semiconductor switch configured to interrupt a current between the input port and the output port;
   a low-pass filter coupled in series with the semiconductor switch;
   a current sensor configured to sense a current provided to the output port from the low-pass filter; and a control circuit coupled to the current sensor and configured to control the semiconductor switch responsive to the sensed current indicating a fault, wherein the control circuit is configured to determine a rate of change of the sensed current and to open the semiconductor switch responsive to the determined rate of change of the sensed current exceeding a rate of change threshold.

10. The circuit breaker of claim 9, wherein the control circuit is configured to determine the rate of change threshold responsive to a voltage applied by the power source.

11. The circuit breaker of claim 9, wherein the control circuit is configured to adjust the rate of change threshold responsive to the sensed current.

* * * * *